(12) United States Patent
Korta et al.

(10) Patent No.: US 10,492,342 B2
(45) Date of Patent: Nov. 26, 2019

(54) SYSTEM FOR COOLING AN ELECTRONIC DEVICE AND ASSEMBLY METHOD

(71) Applicant: Aptiv Technologies Limited, St. Michael (BB)

(72) Inventors: Jakub Korta, Cracow (PL); Marcel Fruend, Remscheid (DE); Pawel Skruch, Mogilany (PL)

(73) Assignee: APTIV TECHNOLOGIES LIMITED (BB)

( * ) Notice: Subject to any disclaimer, the term of this patent is extended or adjusted under 35 U.S.C. 154(b) by 0 days.

(21) Appl. No.: 16/244,672

(22) Filed: Jan. 10, 2019

(65) Prior Publication Data

US 2019/0230823 A1    Jul. 25, 2019

(51) Int. Cl.
*H05K 7/20* (2006.01)
*H01L 23/367* (2006.01)

(52) U.S. Cl.
CPC ..... *H05K 7/20854* (2013.01); *H01L 23/3675* (2013.01); *H05K 7/20172* (2013.01); *H05K 7/20409* (2013.01)

(58) Field of Classification Search
CPC ... H01L 23/467; H01L 23/427; H01L 23/367; H01L 23/3672; G06F 1/20; G06F 1/203; G06F 1/206; H05K 7/20781; H05K 7/2079; H05K 7/20145; H05K 7/20172; H05K 7/20154; H05K 7/20736; H05K 7/20209; H05K 7/20009; H05K 7/20163; H05K 7/2039; H05K 1/0203; H05K 7/20745; H05K 7/20136; H05K 5/03; H05K 7/2049; H05K 7/20754; H05K 7/20918; H05K 7/20718; H05K 7/20709; H05K 7/206; H05K 7/20909; H05K 7/20863

See application file for complete search history.

(56) References Cited

U.S. PATENT DOCUMENTS

| | | | | | |
|---|---|---|---|---|---|
| 5,377,298 | A | * | 12/1994 | Yang | H05B 3/148 219/504 |
| 5,467,250 | A | * | 11/1995 | Howard | H05K 7/206 165/122 |
| 5,940,288 | A | * | 8/1999 | Kociecki | H05K 7/20727 361/688 |

(Continued)

FOREIGN PATENT DOCUMENTS

| | | |
|---|---|---|
| CN | 2 271 026 Y | 12/1997 |
| DE | 10 2008 037372 A1 | 4/2010 |

(Continued)

*Primary Examiner* — Adam B Dravininkas
(74) *Attorney, Agent, or Firm* — Joseph Victor Bonadies (57) ABSTRACT

An electronic device includes a rear end and a front end of a first group of fins respectively defining an air inlet and an air outlet of the first group, a rear end and a front end of a second group of fins respectively defining an air outlet and an air inlet of the second group, means adapted to generate a flow of air between the plurality of fins of the first group from the air inlet to the air outlet of the first group at least one air deflector arranged facing the air outlet of the first group and configured to orient the flow of air toward the air inlet of the second group so that the flow of air is able to flow between the fins of the second group from the air inlet to the air outlet of the second group.

10 Claims, 5 Drawing Sheets

(56) References Cited

U.S. PATENT DOCUMENTS

| | | | | |
|---|---|---|---|---|
| 6,328,529 | B1* | 12/2001 | Yamaguchi | F04D 29/582 |
| | | | | 257/E23.086 |
| 6,999,312 | B1* | 2/2006 | Garnett | H01L 23/467 |
| | | | | 165/80.3 |
| 2002/0011327 | A1* | 1/2002 | Fukazu | F28F 3/04 |
| | | | | 165/80.4 |
| 2002/0179285 | A1* | 12/2002 | Sas | H01L 21/4882 |
| | | | | 165/80.3 |
| 2009/0073654 | A1* | 3/2009 | Beam | H05K 7/20418 |
| | | | | 361/696 |
| 2009/0262500 | A1* | 10/2009 | Makino | H01L 23/4735 |
| | | | | 361/697 |
| 2010/0053868 | A1* | 3/2010 | Yang | G06F 1/20 |
| | | | | 361/679.5 |
| 2012/0057301 | A1* | 3/2012 | Tan | H05K 7/20809 |
| | | | | 361/697 |

FOREIGN PATENT DOCUMENTS

| | | |
|---|---|---|
| EP | 2 334 161 A2 | 6/2011 |
| EP | 3 010 320 A1 | 4/2016 |

* cited by examiner

SYSTEM FOR COOLING AN ELECTRONIC DEVICE AND ASSEMBLY METHOD

TECHNICAL FIELD OF INVENTION

The present invention concerns a system for cooling an electronic device for motor vehicles and its method of assembly with the electronic device.

BACKGROUND OF INVENTION

Electronic devices for motor vehicles generally include electronic components mounted on a printed circuit board. Some electronic components are components producing heat. They may be microcontrollers the data processing speed of which is such that the microcontroller heats up when operating, or again by way of example, they may be electronic components distributing high electrical currents to the equipment of the vehicle, or again simply conductive tracks carrying high currents across the printed circuit board.

In order to cool these components to prevent them from failing, it is known to dissipate the heat thereof by direct thermal coupling of these components to a thermally conductive casing of the device. The casing is generally equipped on its external surface with cooling fins.

During active cooling of the fins, a plurality of fans is frequently used in order to be able to cool all of the fins. For their part the cooling fins are either made in one piece with the casing or form part of a heatsink screwed or fixed by a thermally conductive adhesive to the casing. This type of cooling is subject to a heavy weight constraint and a non-optimum thermal efficiency.

SUMMARY OF THE INVENTION

An electronic device for motor vehicles includes a thermally conductive casing containing a printed circuit board and an element producing heat mounted on the printed circuit board. The casing includes a casing bottom on which the printed circuit board is mounted and includes a cover opposite the casing bottom. The casing also includes a plurality of cooling fins extending over the exterior surface of the cover from a rear end of the plurality of fins to a front end of the plurality of fins, the plurality of fins comprising a first group of fins and a second group of fins, each group of fins extending from the rear end to the front end, the rear end of the first group and the front end of the first group respectively defining an air inlet of the first group and an air outlet of the first group, the rear end of the second group and the front end of the second group respectively defining an air outlet of the second group and an air inlet of the second group.

Means adapted to generate a flow of air between the plurality of fins of the first group are arranged on the casing, the flow of air being able to flow from the air inlet of the first group to the air outlet of the first group so as to enable cooling of the plurality of fins of the first group. The electronic device comprises at least one air deflector arranged facing the air outlet of the first group and is configured to orient the flow of air toward the air inlet of the second group so that the flow of air is able to flow between the fins of the second group from the air inlet of the second group to the air outlet of the second group in order to enable cooling of the fins of the second group.

At least one group of fins may be delimited on respective opposite sides by two vertical walls extending over the exterior surface of the cover and extending along said group of fins from the air inlet of said group to the air outlet of said group, so as thereby to form an air guide adapted to channel the flow of air that is able to flow between the fins of said group.

The device may comprise a cap to protect the fins comprising an upper wall adapted to bear on the summit of the plurality of fins of the first group and of the second group.

The upper wall may be made in one piece with the air deflector and with the vertical walls.

The plurality of cooling fins may comprise at least one fan-folded metal strip, the folding forming the fins each extending transversely to the strip, and spaces between fins forming contact zones between fins with the exterior surface of the cover, and the strip may be arranged as a first row of fins so that the flow of air is able to circulate transversely to the strip.

The plurality of fins may comprise a second row of fins including another fan-folded metal strip forming fins and spaces between fins, the second row of fins being arranged along the first row of fins, the fins of the second row being arranged facing the spaces between fins of the first row.

The contact zones between fins may be brazed to the exterior surface of the cover.

The upper wall may be a metal wall brazed to the summit of the plurality of fins of the first group and of the second group.

A method in accordance with the invention of assembling the electronic device comprises the steps of: Fan-folding at least one metal strip so as to form cooling fins, each extending transversely to the strip, and spaces between fins forming contact zones between fins; arranging the contact zones between fins of the folded metal strip on the metal cover of the electronic device; brazing the contact zones between fins to the metal cover of the electronic device; arranging on the casing of the electronic device means adapted to generate a flow of air between the fins of a first group of fins of the metal strip in a first direction transverse to the strip; arranging the air deflector on the casing so as to be able to orient the flow of air between the fins of a second group of fins of the metal strip in a second direction transverse to the strip and opposite the first direction.

The step of brazing the contact zones between fins may comprise the steps of: disposing so as to bear on the summit of the fins of the metal strip the upper wall of a metal cap comprising at least two opposite lateral walls arranged transversely on respective opposite sides of the strip on top of the cover; exerting a bearing force on the upper wall of the metal cap against the summit of the fins generating flexing of the fins so as to maintain the lateral walls of the metal cap on the exterior surface of the cover; brazing the upper wall of the metal cap to the summit of the fins with the bearing force present; brazing the lateral walls of the metal cap to the exterior surface of the cover with the bearing force present; brazing the contact zones between fins of the metal strips to the exterior surface of the cover with the bearing force present.

Further features and advantages will appear more clearly on a reading of the following detailed description of the preferred embodiment, which is given by way of non-limiting example only and with reference to the accompanying drawings.

BRIEF DESCRIPTION OF DRAWINGS

Other features, objects and advantages of the invention will become apparent on reading the following detailed description with reference to the appended drawings, provided by way of nonlimiting example, and in which.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

'One or more' includes a function being performed by one element, a function being performed by more than one element, e.g., in a distributed fashion, several functions being performed by one element, several functions being performed by several elements, or any combination of the above.

It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact.

The terminology used in the description of the various described embodiments herein is for describing embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

In order to facilitate the description, and not in any limiting way, an orthogonal system of axes comprising a longitudinal axis L, a transverse axis T and a vertical axis V is defined. The orientations "low", "high", "top", "bottom", "lower" and "upper" are defined relative to the vertical direction. The orientations "left", "right" and "lateral" are defined relative to the transverse direction. The orientations "rear" and "front" are defined relative to the longitudinal direction.

Figure 1:
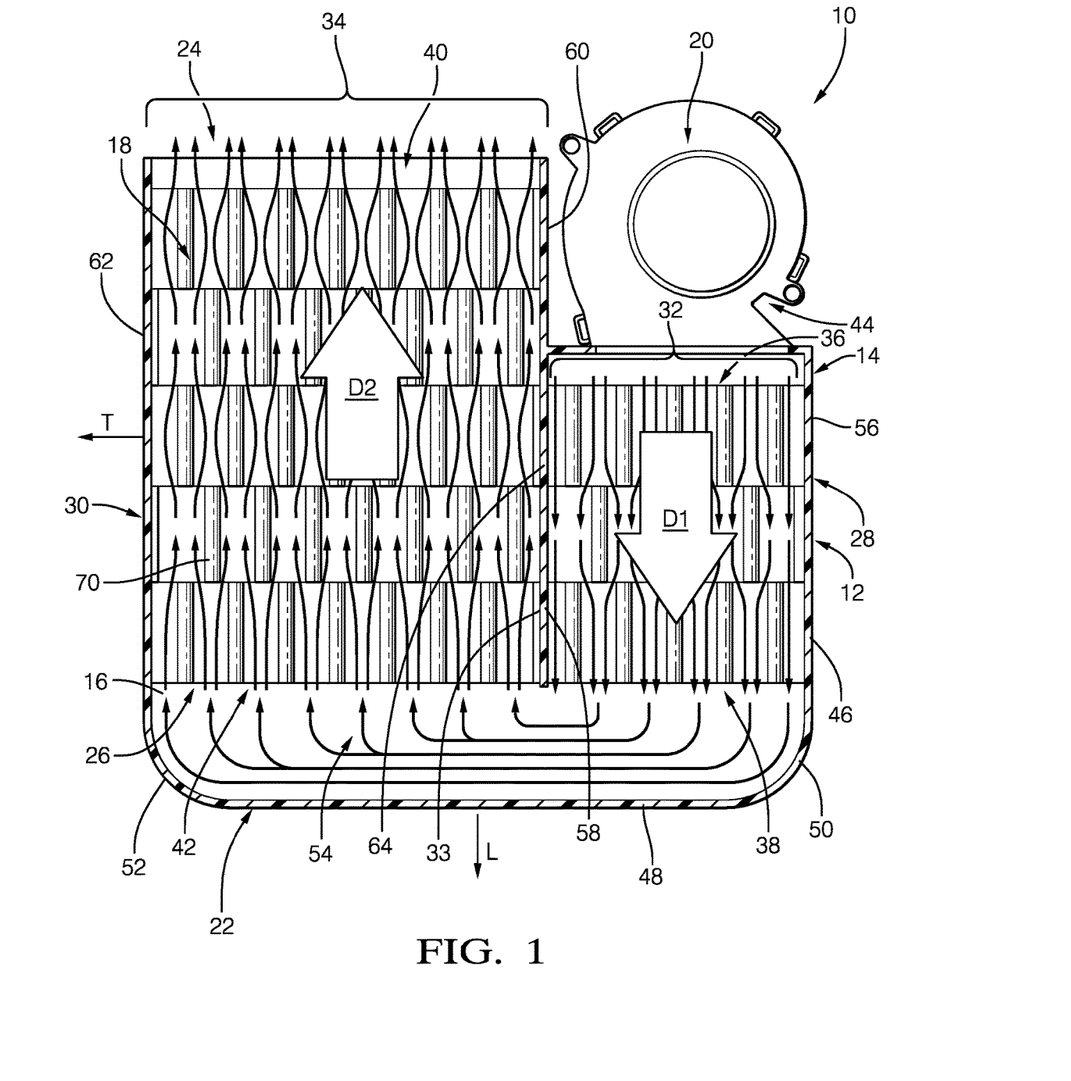
FIG. 1 is a diagrammatic top view of an electronic device for motor vehicles according to a first embodiment equipped with a fan for generating a flow of air between cooling fins.
Figure 2:
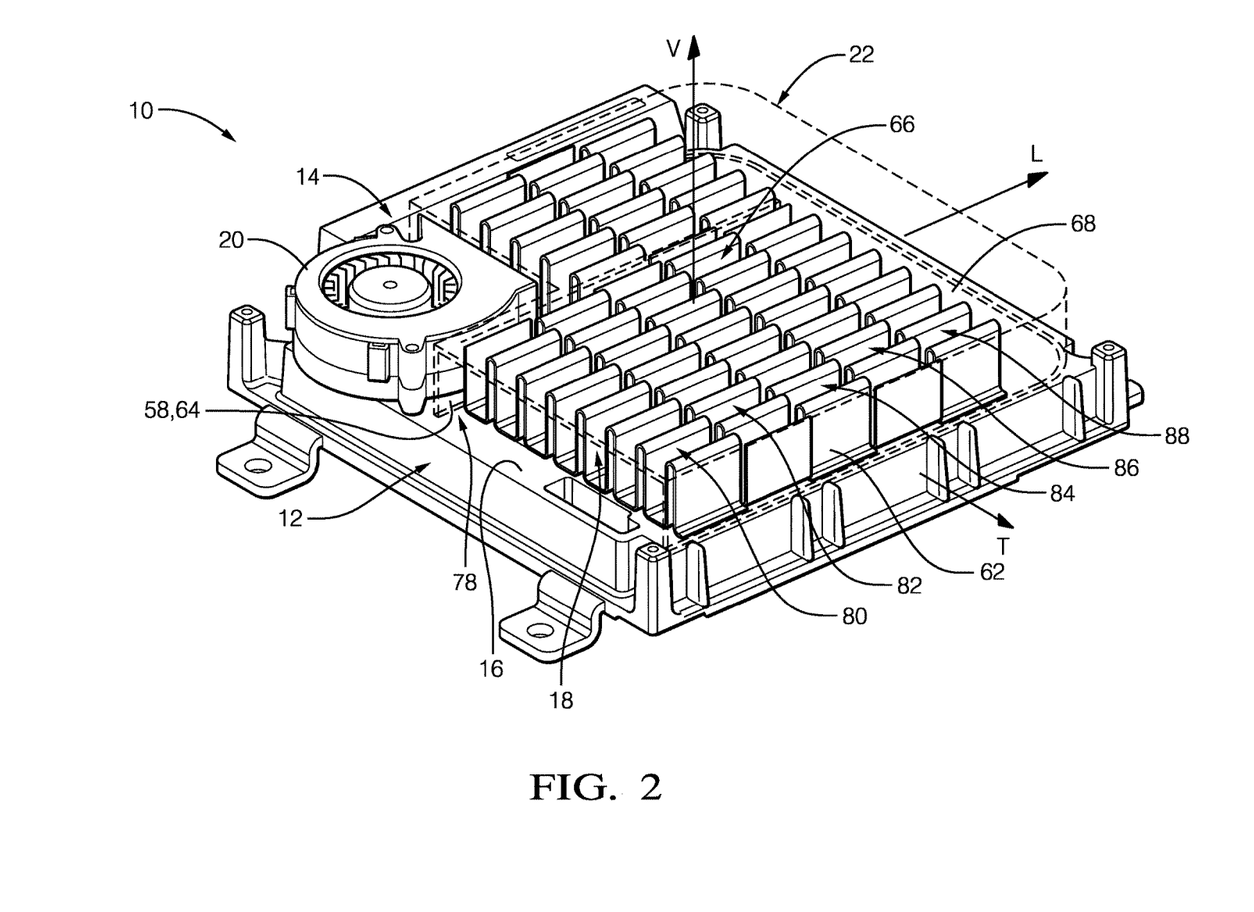
FIG. 2 is a diagrammatic perspective view of the electronic device from FIG. 1 comprising a cap for protecting the cooling fins, represented as if it were transparent.

In FIG. 1 and FIG. 2, an electronic device 10 for motor vehicles comprises a thermally conductive casing 12 containing a printed circuit board (not shown) and an element producing heat (not shown) mounted on the printed circuit board. The casing 12 includes a casing bottom on which the printed circuit board is mounted and a cover 14 opposite the casing bottom. The cover 14 is equipped on its exterior surface 16 with a plurality of cooling fins 18, a fan 20 and an air deflector 22.

The plurality of fins 18 extends along the longitudinal axis L on the exterior surface 16 of the cover 14 from a rear end 24 to a front end 26. The plurality of fins extends along the transverse axis T on the exterior surface 16 of the cover 14 from a left-hand edge 28 to a right-hand edge 30. In the embodiment shown, the rear end 24 of the plurality of fins 18 is not a rectilinear end, but forms a step-shaped border extending transversely; the front end 26 of the plurality of fins 18 forms a rectilinear transverse border.

The plurality of fins 18 comprises a first group 32 of fins 18 and a second group 34 of fins 18 extending longitudinally from the rear end 24 to the front end 26. To be more precise, the first group 32 of fins 18 extends from the downward step at the rear end 24 to the front end 26 so as to have a length along the longitudinal axis shorter than the second group 34 of fins 18.

In the embodiment shown, the first group 32 of fins 18 and the second group 34 of fins 18 comprise all the fins 18 of the plurality of fins 18, the first group 32 of fins 18 being adjacent to the second group 34 of fins 18. In other words, the first group 32 of fins 18 is delimited with respect to the second group 34 of fins 18 by a common border 33.

The rear end 24 when referring to the first group 32 of fins 18 will be termed the rear end of the first group 32. The rear end 24 when referring to the second group 34 of fins 18 will be termed the rear end 24 of the second group 34. The front end 26 when referring to the first group 32 of fins 18 will be termed the front end of the first group 32. The front end 26 when referring to the second group 34 of fins 18 will be termed the front end 26 of the second group 34.

The rear end 24 of the first group 32 defines an air inlet 36 of the first group 32 and the front end 26 of the first group 32 defines an air outlet 38 of the first group 32. The rear end 24 of the second group 34 and the front end 26 of the second group 34 respectively define an air outlet 40 of the second group 34 and an air inlet 42 of the second group 34.

The rear end 34 in the form of a downward step makes it possible to free up a first space 44 on the exterior surface 16 of the cover 14 so as to be able to arrange therein means adapted to generate a flow of air 46 between the plurality of fins 18 of the first group 32, such as the, preferably radial flow fan 20. The fan 20 is arranged so as to be able to generate the flow of air 46 able to circulate directly between the plurality of fins 18 of the first group 32 in a first direction D1 from the air inlet 36 of the first group 32 to the air outlet 38 of the first group 32 so as to enable cooling of the fins 18 of the first group 32.

The air deflector 22 arranged facing the air outlet 38 of the first group 32 is configured to orient the flow of air 46 toward the air inlet 42 of the second group 34 so that the flow of air 46 is able to flow between the fins 18 of the second group 34 in a second direction D2 from the air inlet 42 of the second group 34 to the air outlet 40 of the second group 34 in order to enable cooling of the fins 18 of the second group 34.

To be more precise, the air deflector 22 comprises a vertical wall 48 for deflecting the flow of air 46 arranged on the exterior surface 16 of the cover 14 and extending along the transverse axis T the length of the air outlet 38 of the first group 32 and the length of the air inlet 42 of the second group 34. The vertical wall 48 for deflecting the flow of air 46 extends from its left-hand edge 50 to its right-hand edge 52, each of said edges 50, 52 being curved toward the cooling fins 18 so as to be able to deflect the flow of air 46 from the air outlet 38 of the first group 32 of fins 18 toward the air inlet 42 of the second group 34 of fins 18.

The vertical wall 48 for deflecting the flow of air 46 from the air deflector 22 preferably comprises a rectilinear portion extending along the transverse axis T from its left-hand edge 50 curved toward the left-hand edge 28 of the plurality of fins 18 to its right-hand edge 52 curved toward the right-hand edge 30 of the plurality of fins 18. The air deflector 22 therefore extends all along the air outlet 38 of the first group 32 and the air inlet 42 of the second group 34. The vertical wall 48 for deflecting the flow of air 46 from the air deflector 22 is at a distance from the front end 26 of the plurality of fins 18 so as to define a second space 54 on the exterior surface 16 of the cover 14 enabling the flow of air 46 to transit from the air outlet 38 of the first group 32 of fins 18 to the air inlet 42 of the second group 34 of fins 18.

The invention is not limited to a particular shape of the air deflector 22. The vertical wall 48 for deflecting the flow of air 46 can have various shapes so as to be able to deflect the flow of air from an air outlet to an air inlet.

In contrast to the known prior art in which electronic devices can be equipped with a plurality of fans in order to cool all of the cooling fins, integrating the air deflector 22 onto the casing 12 makes it possible to reduce the number of fans to a single fan 20 of a size appropriate to the electronic device 10 for motor vehicles.

In order to encourage and to channel the flow of the flow of air 46 that is able to circulate between the fins 18 of the first group 32, two vertical walls 56, 58 are arranged longitudinally on respective opposite sides of the first group 32 of fins 18. In other words, the two first vertical walls 56, 58 laterally delimit the first group 32 of fins 18. Each first vertical wall 56, 58 extends all along the first group 32 of fins 18.

Similarly, in order to encourage and to channel the flow of the flow of air 46 between the fins 18 of the second group 34, two second vertical walls 60, 62 are arranged longitudinally on respective opposite sides of the second group 34 of fins 18. In other words, the two second vertical walls 60, 62 laterally delimit the second group 34 of fins 18. Each second vertical wall 60, 62 extends all along the second group 34 of fins 18. In the embodiment shown, the common border 33 between the first group 32 of fins 18 and the second group 34 of fins 18 is materialized by a vertical wall 64 common to the two first vertical walls 56, 58 and to the two second vertical walls 60, 62. In other words, the electronic device 10 shown comprises only three vertical walls 56, 62, 64 forming an air guide 31 for the fins 18 of the first group 32 and forming another air guide 35 for the fins 18 of the second group 34.

Generally speaking, in order to channel the flow of air 46 able to flow between the fins 18 of a group 32, the group of fins 18 is delimited on respective opposite sides by two vertical walls 56, 64 extending on the exterior surface 16 of the cover 14 and extending along said group 32 of fins 18 from the air inlet 36 of said group 32 to the air outlet 38 of said group 32 so as thereby to form an air guide.

In FIG. 2, the electronic device 10 includes a cap 66 to protect the fins 18 comprising an upper wall 68 arranged on top of the first group 32 of fins 18 and the second group 34 of fins 18. In order to show the cooling fins, the protective cap 66 is represented as if it were transparent. More particularly, the upper wall 68 is arranged to bear on the summit 70 of the cooling fins 18 of the first group 32 of fins 18 and the second 34 group of fins 18. The cap 66 enables prevention of the deposition of dust or other impurities between the fins 18 which could reduce the cooling of the fins 18 by the flow of air 46.

Figure 3:
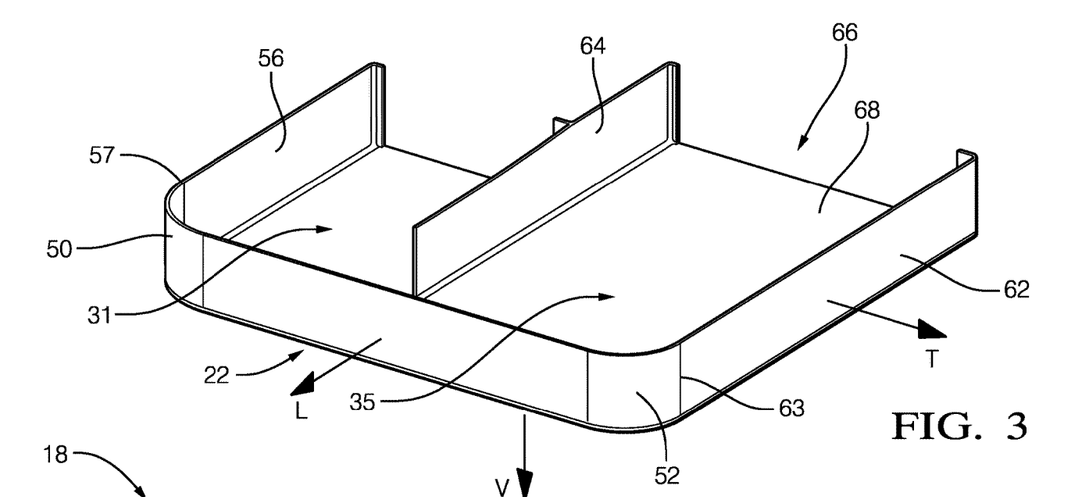
FIG. 3 is a diagrammatic perspective view from below of the protective cap from FIG. 2.

In FIG. 2 and FIG. 3, the cap 66 for protecting the fins 18 comprises the air deflector 22 and the three vertical walls 56, 62, 64 form the air guide 31 of the first group 32 of fins 18 and the air guide 35 of the second group 34 of fins 18. To be more precise, the upper wall 68 of the cap 66 is made in one piece with the three vertical walls 56, 62, 64 forming the air guides 31, 35 and with the vertical wall 48 for deflecting the flow of air 46 of the air deflector 22.

The three vertical walls 56, 62, 64 of the protective cap 66 are formed by a left-hand vertical lateral wall 56, a right-hand vertical lateral wall 62 and a vertical interior wall 64 arranged parallel to the two lateral walls 56, 62. Each of the two lateral walls 56, 62 extends along the longitudinal axis L from their rear end to their front end so as to extend along the right-hand edge 30 and the left-hand edge 28 of the plurality of fins 18. The internal wall is the common vertical wall 64 separating the first group 32 of fins 18 and the second group 34 of fins 18.

The front end 63 of the right-hand lateral wall 62 and the front end 57 of the left-hand lateral wall 56 are respectively continuous with the curved right-hand edge 52 of the air deflector 22 and with the curved left-hand edge 50 of the air deflector 22.

In one particular embodiment, the cap 66 for protecting the fins 18 is a metal cap 66 so as to improve the dissipation of heat from the electronic device 10.

Figure 4:
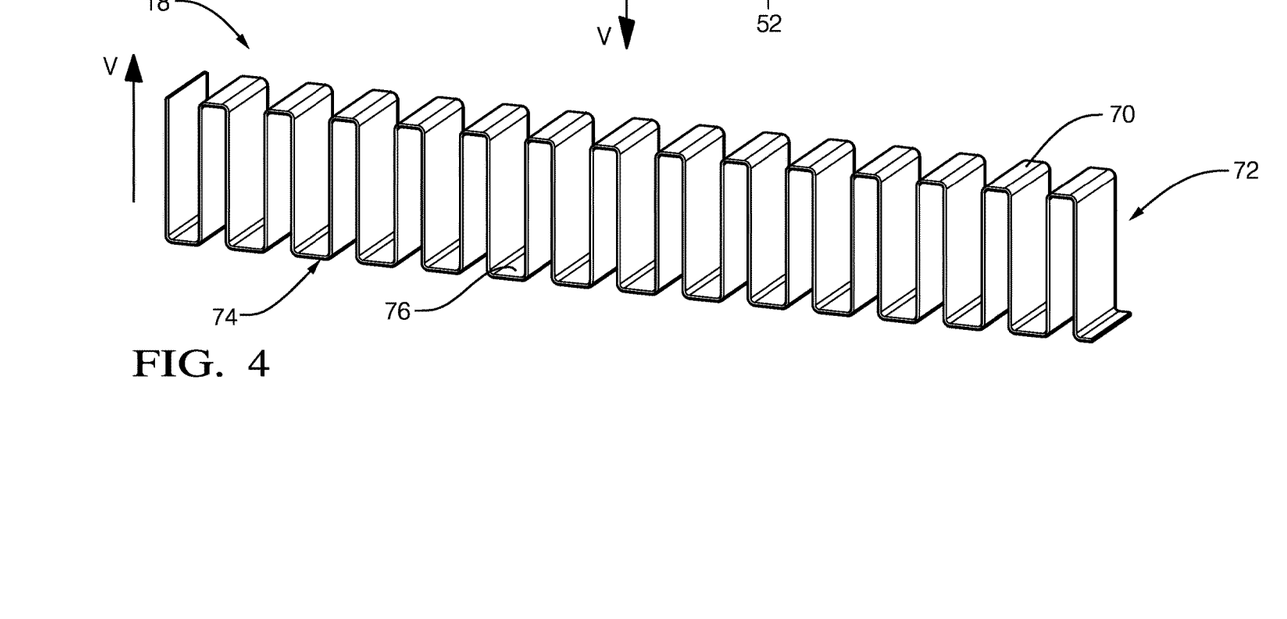
FIG. 4 is a diagrammatic perspective view of a strip of cooling fins of the electronic device in accordance with a first embodiment.

A strip 72 of fins 18 forming the plurality of fins 18 is shown in FIG. 4. The plurality of cooling fins 18 is formed by fan-folded metal strips 72, the folding forming cooling fins 18 each extending transversely to the strip and spaces 74 between fins forming contact zones 76 between fins designed to be arranged on the exterior surface 16 of the cover 14 of the electronic device 10. The resulting fins 18 generally extend vertically overall in a rectilinear manner.

The metal strips 72 are more particularly cut from thin sheet metal. The cooling fins 18 are fabricated from thin (for example 0.3-0.5 mm thick) layers of "aluminium brazing sheet" divided into strips 72 with a required width. In order to form the fins 18 each aluminium strip 72 is folded mechanically to a required shape and a required height.

An aluminium brazing sheet is a type of composite material designed to improve the brazing process. It is a laminate with three layers constituted of a core material (for example, AA3003, for which k=180 W/(mK)) covered on one or both sides by (15) an Al—Si basic coating (for example AA 4343 alloy, which is Al-6.8-8.2 wt % Si). The laminate is fabricated by hot and cold rolling, heat treated if required. The Al—Si coating alloy melts and flows at a lower temperature (577° C.-610° C.) than the base alloy, cooling a joint brazed to the surrounding metal components.

The strips 72 of cooling fins 18 are particularly designed to be brazed to the exterior surface 16 of the cover 14 of the electronic device 10.

The assembly of the strips 72 of fins 18 to the cover 14 using brazed joints enables solution of the problem of the high thermal resistance between an electronic casing and the heat dissipating surface (heatsink). The solution using brazed joints between the cover 14 of the casing 12 and the strips 72 of fins 18 make it possible to increase the thermal conductivity between the cover 14 and the fins 18, the brazing material having a thermal conductivity one or two orders of magnitude higher than a dry joint or a joint equipped with a thermal interface material as commonly used in the prior art.

Using this technology for the cooling fins 18, the same heat dissipation zone can be obtained with significant weight savings compared to fins 18 formed by casting or drawing the metal cover of the electronic device 10. Moreover, by increasing the number of fin folds 18, the overall heat dissipation area can be much greater compared to a heatsink with the same outside dimensions.

In FIG. 2, the strips 72 of fins 18 are arranged on the exterior surface 16 of the cover 14 of the electronic device 10 so that the flow of air 46 is able to circulate transversely to the strips 72. The strips 72 of fins 18 extend in the direction of the transverse axis T forming rows 80, 82, 84, 86, 88 of fins 18 adjacent to one another. A row 84 of fins 18 may more particularly be formed of two strips 72 of fins slightly spaced from each other so as to free up a bearing zone 78 for the common vertical wall 64 of the protective cover 66 on the exterior surface 16 of the cover 14 of the electronic device 10.

In the embodiment shown in FIG. 2, the cover 14 of the electronic device 10 comprises rows 84, 86, 88 of fins 18 belonging simultaneously to the first group 32 of fins 18 and to the second group 34 of fins 18 and other rows 80, 82 of fins 18 belonging only to the second group 34 of fins 18. The rows 84, 86, 88 of fins 18 belonging simultaneously to the first group 32 of fins 18 and to the second group 34 of fins 18 extend along the transverse axis T from the right-hand edge 30 of the exterior surface 16 of the cover 14 to the left-hand edge 28 of the exterior surface 16 of the cover 14. The other rows 80, 82 of fins 18 belonging only to the second group 34 of fins 18 extend along the transverse axis T from the right-hand edge 30 of the exterior surface 16 of the cover 14 to the first space 44 on which the axial flow fan 20 is arranged. The rows 84, 86, 88 of fins 18 preferably belonging simultaneously to the first group 32 of fins 18 and to the second group 34 of fins 18 are each formed by two strips 72 of fins 18 slightly spaced from one another so as to free up the bearing zone 78 on the exterior surface 16 of the cover 14 on which the common vertical walls 64 of the cap 66 comes to abut in order to delimit the air guide 31 of the first group 32 of fins 18 and the air guide 35 of the second group 34 of fins 18.

To optimize the cooling of the fins, the rows 80, 82, 84, 86, 88 of fins 18 are more particularly arranged one after the other adjacently and so that the fins 18 of a row 82 are arranged facing the spaces 74 between fins of the directly adjacent row 84 of fins. This offset enables the flow of air 46 to cool more efficiently the fins 18 of each row 80, 82, 84, 86, 88.

Figure 5:
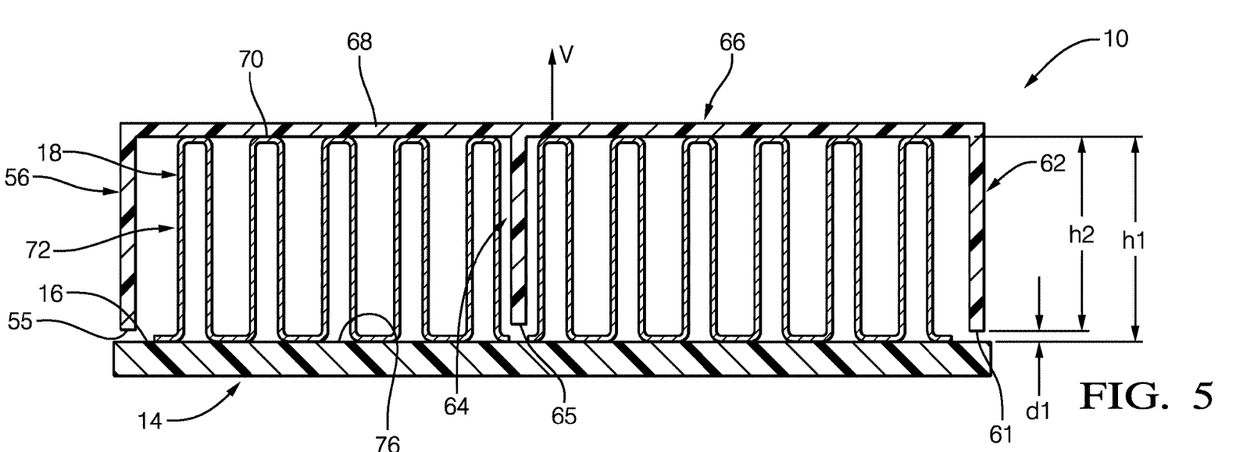
FIG. 5 is a diagrammatic view in axial section of the arrangement of the cap protecting the cooling fins with the cooling fins and with the cover of the electronic device before assembling them by brazing.

In FIG. 5, the cooling fins 18 and the cap 66 for protecting the fins 18 are shown before brazing them onto the exterior surface 16 of the cover 14 of the electronic device 10. Each strip 72 of fins 18 is arranged on the exterior surface 16 of the cover 14, more particularly the contact zones 76 between fins are disposed on the exterior surface 16 of the cover 14 without being fixed thereto. The upper wall 68 of the protective cap 66 bears on the summit 70 of the fins 18. The height h1 along the vertical axis V of the fins 18 is slightly greater than the height h2 along the vertical axis V of the vertical walls 56, 62, 64 of the cap 66 so that the bottom end 55, 61, 65 of each vertical wall 56, 62, 64 is not in contact with the exterior surface 16 of the cover 14. By way of nonlimiting example, this height difference dl can be of the order of a few millimeters (mm), preferably less than 5 mm.

Figure 6:
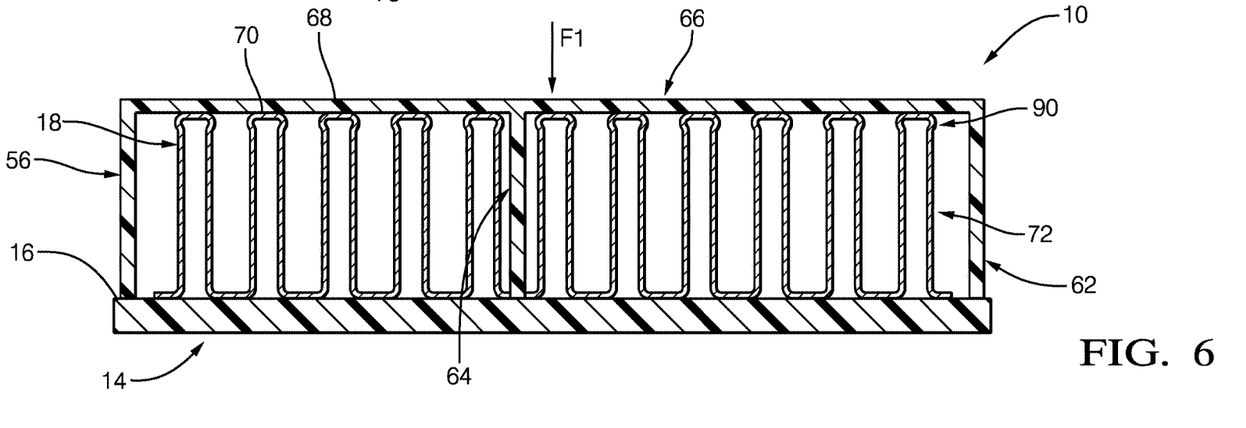
FIG. 6 is a diagrammatic view in axial section of the arrangement of the cap protecting the cooling fins with the cooling fins and the cover of the electronic device after assembling them by brazing.

In FIG. 6, the cooling fins 18 and the cap 66 for protecting the fins are shown brazed onto the exterior surface 16 of the cover 14 of the electronic device 10. The upper wall 68 of the cap 66 is more particularly brazed to the summit 70 of the fins 18. During the step of brazing the protective cover 66 to the exterior surface 16 of the cover 14 and brazing the strips 72 of fins to the exterior surface 16 of the cover 14, a bearing force F1 is exerted on the upper wall 68 of the protective cap 66 toward the cover 14 so as to bring the bottom ends 55, 61, 65 of the vertical walls 56, 62, 64 of the cap 66 into contact with the exterior surface 16 of the cover 14. This method makes it possible to circumvent variations in the height h1 of the fins 18 when assembling the cap 66 onto the summit 70 of the fins 18 and the exterior surface 16 of the cover 14.

The bearing force F1 on the upper wall 68 of the cap 66 pressing it against the summit 70 of the fins 18 causes flexing of the fins 18 so as to retain the vertical walls 56, 62, 64 of the cap 66 on the exterior surface 16 of the cover 14. The flexing of the fins 18 more particularly results in deformation of the summit 70 of the fins 18. The deformation may more particularly take the form of a boss 90 protruding toward the outside of the vertical walls of the fins 18. Other types of deformation of the fins 18 may be seen depending on the stiffness of the fins 18 and on the stiffness of the contact zones 76 between fins.

The air deflector 22 is preferably assembled onto the exterior surface 16 of the cap 14 in exactly the same way as the vertical walls 56, 62, 64 forming the air guides 31, 35.

Figure 7:
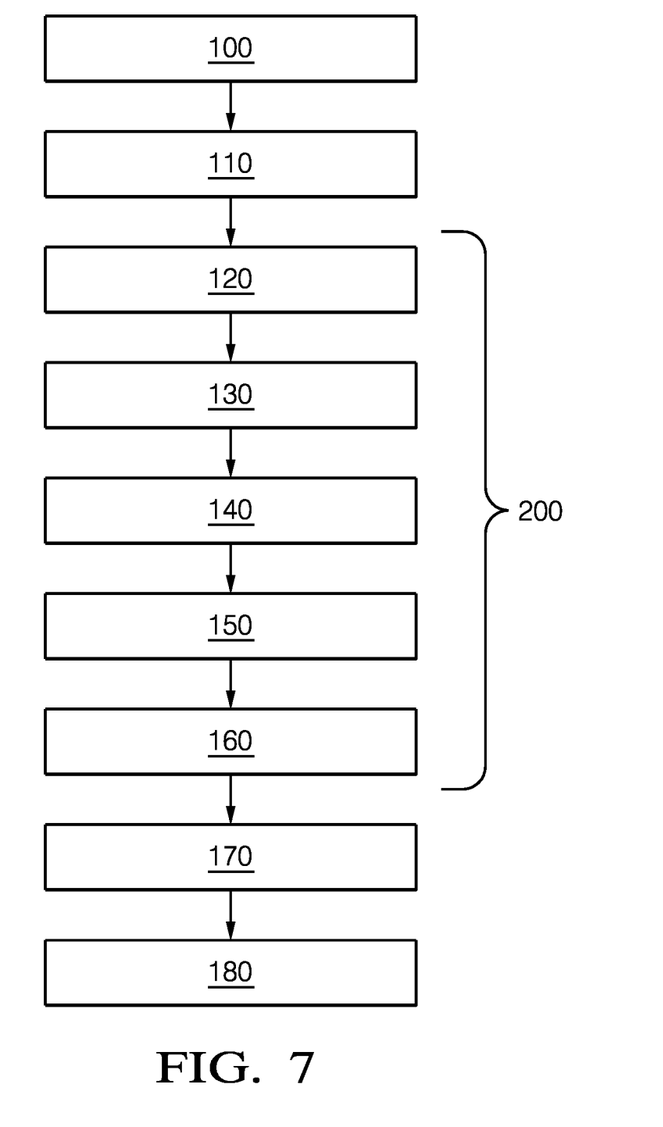
FIG. 7 is an example of a flowchart of a method of assembling the electronic device in accordance with the invention.

In FIG. 7, a method of assembling the electronic device 10 shown in FIG. 2 comprises a plurality of steps. The method includes a step 100 of fan-folding metal strips 72 to form cooling fins 18, each extending transversely to the strips 72, and spaces 74 between fins forming contact zones 76 between fins. A subsequent step 110 consists in arranging the contact zones 76 between fins of the folded metal strips 72 on the exterior surface 16 of the metal cover 14 of the electronic device 10. The metal strips 72 are preferably arranged adjacent to one another and so that the flow of air 46 is able to circulate transversely to the strips 72. Once the folded metal strips 72 have been arranged on the cover 14, a step 200 brazes the contact zones 76 between fins onto the metal cover 14 of the electronic device 10.

The step 200 of brazing the contact zones 76 between fins preferably comprises a first step 120 disposing on the summit 70 of the fins 18 of the metal strip 72 the upper wall 68 of the metal cap 66 comprising the vertical walls 56, 62, 64 arranged transversely on respective opposite sides of the strips 72. A second step 130 exerts a bearing force F1 on the upper wall 68 of the cap 66 to press it against the summit 70 of the fins 18 so as to hold the vertical walls 56, 62, 64 of the cap 66 on the exterior surface 16 of the cover 14. This second step results in flexing of the fins 18. A third step brazes 140 the upper wall 68 of the cap 66 to the summit 70 of the fins 18 with the bearing force F1 present, brazes 150 the vertical walls 56, 62, 64 of the cap 66 to the exterior surface 16 of the cover 14 with the bearing force F1 present and brazes 160 the contact zones 76 between fins of the metal strips 72 to the exterior surface 16 of the cover 14 with the bearing force F1 present.

Finally, in order to be able to generate the flow of air 46 between the fins 18 of the first group 32 of fins 18 and the second group 34 of fins 18, a step 170 arranges on the casing 12 of the electronic device 10 the means designed to generate the flow of air between the fins 18 of the first group 32 of fins 18 in the first direction D1 transverse to the strips 72 of fins and another step 180 arranges on the casing 12 of the electronic device 10 the air deflector 22 so as to be able to orient the flow of air 46 between the fins 18 of the second group 34 of fins 18 in the second direction D2 transverse to the strips 72 of fins, said second direction D2 being opposite the first direction D1.

While this invention has been described in terms of the preferred embodiments thereof, it is not intended to be so limited, but rather only to the extent set forth in the claims that follow.

We claim:

1. An electronic device (10) for motor vehicles comprising:
    a thermally conductive casing (12) containing a printed circuit board and an element producing heat mounted on the printed circuit board, the casing (12) includes a casing bottom on which the printed circuit board is mounted and including a cover (14) opposite the casing bottom;
    a plurality of cooling fins (18) extending over the exterior surface (16) of the cover (14) from a rear end (24) of the plurality of fins (18) to a front end (26) of the plurality of fins (18), the plurality of fins (18) comprising a first group (32) of fins (18) and a second group (34) of fins (18), each group (32, 34) of fins (18) extending from the rear end (24) to the front end (26), the rear end (24) of the first group (32) and the front end (26) of the first group (32) respectively defining an air inlet (36) of the first group (32) and an air outlet (38) of the first group (32), the rear end (24) of the second group (34) and the front end (26) of the second group (34) respectively defining an air outlet (40) of the second group and an air inlet (36) of the second group (34);
    means (20) adapted to generate a flow of air (46) between the plurality of fins (18) of the first group (32), the flow of air (46) being able to flow from the air inlet (36) of the first group (32) to the air outlet (38) of the first group (32) so as to enable cooling of the plurality of fins (18) of the first group (32), wherein
    the electronic device (10) comprises at least one air deflector (22) arranged facing the air outlet (38) of the first group (32) and is configured to orient the flow of air (46) toward the air inlet (42) of the second group (34) so that the flow of air (46) is able to flow between the fins (18) of the second group (34) from the air inlet (42) of the second group (34) to the air outlet (40) of the second group (34) in order to enable cooling of the fins (18) of the second group (34).

2. The electronic device (10) according to claim 1, wherein at least one group (32) of fins (18) is delimited on respective opposite sides by two vertical walls (56, 64) extending over the exterior surface (16) of the cover (14) and extending along said group (32) of fins (18) from the air inlet (36) of said group (32) to the air outlet (38) of said group (32), so as thereby to form an air guide (31) adapted to channel the flow of air (46) that is able to flow between the fins (18) of said group (32).

3. The electronic device (10) according to claim 1, wherein the electronic device includes a cap (66) to protect the fins (18) comprising an upper wall (68) adapted to bear on the summit (70) of the plurality of fins (18) of the first group (32) and of the second group (34).

4. The electronic device (10) according to claim 3, wherein the upper wall (68) is a metal wall brazed to the summit (70) of the plurality of fins (18) of the first group (32) and of the second group (34).

5. The electronic device (10) according to claim 1, wherein the upper wall (68) is made in one piece with the air deflector (22) and with the vertical walls (56, 64).

6. The electronic device (10) according to claim 1, wherein the plurality of cooling fins (18) comprises at least one fan-folded metal strip (72), the folding forming the fins (18) each extending transversely to the strip (72), and spaces (74) between fins forming contact zones (76) between fins with the exterior surface (16) of the cover (14), the strip (72) being arranged as a first row (84) of fins (18) so that the flow of air (46) is able to circulate transversely to the strip (72).

7. The electronic device (10) according to claim 6, wherein the plurality of fins (18) comprises a second row (86) of fins (18) including another fan-folded metal strip (72) forming fins (18) and spaces (74) between fins, the second row (86) of fins (18) being arranged along the first row (84) of fins, the fins (18) of the second row (86) being arranged facing the spaces (74) between fins of the first row (84).

8. The electronic device (10) according to claim 6, wherein the contact zones (76) between fins are brazed to the exterior surface (16) of the cover (14).

9. A method of assembling an electronic device (10), said method comprising:
    fan-folding (100) at least one metal strip (72) so as to form cooling fins (18), each extending transversely to the strip (72), and spaces (74) between fins forming contact zones (76) between fins;
    arranging (110) the contact zones (76) between fins of the folded metal strip (72) on a metal cover (14) of the electronic device (10);
    brazing (200) the contact zones (76) between fins to the metal cover (14) of the electronic device (10);
    arranging (170) on a casing (12) of the electronic device (10) means (20) adapted to generate a flow of air (46) between the fins (18) of a first group (32) of fins (18) of the metal strip (72) in a first direction (D1) transverse to the strip (72);
    arranging (180) an air deflector (22) on the casing (12) so as to be able to orient the flow of air (46) between the fins (18) of a second group (34) of fins (18) of the metal strip (72) in a second direction (D2) transverse to the strip (72) and opposite the first direction (D1).

10. The method according to claim 9, wherein the step (200) of brazing the contact zones (76) between fins includes disposing (120) so as to bear on the summit (70) of the fins (18) of the metal strip (72) the upper wall (68) of a metal cap (66) comprising at least two opposite lateral walls (56, 64) arranged transversely on respective opposite sides of the strip (72) on top of the cover (14);

exerting (130) a bearing force (F1) on the upper wall (68) of the metal cap (66) against the summit (70) of the fins (18) generating flexing of the fins (18) so as to maintain the lateral walls (56, 64) of the metal cap (66) on the exterior surface (16) of the cover (14);

brazing (140) the upper wall (68) of the metal cap (66) to the summit (70) of the fins (18) with the bearing force (F1) present;

brazing (150) the lateral walls (56, 64) of the metal cap (66) to the exterior surface (16) of the cover (14) with the bearing force (F1) present; and brazing (160) the contact zones (76) between fins of the metal strips (72) to the exterior surface (16) of the cover (14) with the bearing force (F1) present.

\* \* \* \* \*